US008461061B2

(12) United States Patent
Alexander et al.

(10) Patent No.: US 8,461,061 B2
(45) Date of Patent: Jun. 11, 2013

(54) QUARTZ BOAT METHOD AND APPARATUS FOR THIN FILM THERMAL TREATMENT

(75) Inventors: Paul Alexander, San Jose, CA (US); Jurg Schmitzberger, San Jose, CA (US); Ashish Tandon, Sunnyvale, CA (US); Robert D. Wieting, Simi Valley, CA (US)

(73) Assignee: Stion Corporation, San Jose, CA (US)

( * ) Notice: Subject to any disclaimer, the term of this patent is extended or adjusted under 35 U.S.C. 154(b) by 58 days.

(21) Appl. No.: 13/171,089

(22) Filed: Jun. 28, 2011

(65) Prior Publication Data

US 2012/0021552 A1 Jan. 26, 2012

Related U.S. Application Data

(60) Provisional application No. 61/367,211, filed on Jul. 23, 2010.

(51) Int. Cl.
*H01L 21/00* (2006.01)
(52) U.S. Cl.
USPC .................. 438/795; 432/253; 257/E21.497
(58) Field of Classification Search
USPC .................. 438/550; 432/261; 257/E21.471, 257/E21.497
See application file for complete search history.

(56) References Cited

U.S. PATENT DOCUMENTS

| 3,520,732 A | 7/1970 | Nakayama et al. |
| 3,828,722 A | 8/1974 | Reuter et al. |
| 3,975,211 A | 8/1976 | Shirland |
| 4,062,038 A | 12/1977 | Cuomo et al. |
| 4,204,933 A | 5/1980 | Barlow et al. |
| 4,213,781 A | 7/1980 | Noreika et al. |
| 4,239,553 A | 12/1980 | Barnett et al. |
| 4,263,336 A | 4/1981 | Thompson et al. |
| 4,332,974 A | 6/1982 | Fraas |
| 4,335,266 A | 6/1982 | Mickelsen et al. |
| 4,347,436 A | 8/1982 | Fukuda et al. |
| 4,441,113 A | 4/1984 | Madan |

(Continued)

FOREIGN PATENT DOCUMENTS

| AU | 1998/78651 | 2/1999 |
| AU | 2001/40599 A1 | 8/2001 |

(Continued)

OTHER PUBLICATIONS

Baumann, A., et al., Photovoltaic Technology Review, presentation Dec. 6, 2004, 18 pages.

(Continued)

*Primary Examiner* — Cheung Lee
(74) *Attorney, Agent, or Firm* — Kilpatrick Townsend & Stockton LLP

(57) ABSTRACT

A method of supporting a plurality of planar substrates in a tube shaped furnace for conducting a thermal treatment process is disclosed. The method uses a boat fixture having a base frame including two length portions and a first width portion, a second width portion, and one or more middle members connected between the two length portions. Additionally, the method includes mounting a removable first grooved rod respectively on the first width portion, the second width portion, and each of the one or more middle members, each first grooved rod having a first plurality of grooves characterized by a first spatial configuration. The method further includes inserting one or two substrates of a plurality of planar substrates into each groove in the boat fixture separated by a distance.

15 Claims, 7 Drawing Sheets

U.S. PATENT DOCUMENTS

| | | | |
|---|---|---|---|
| 4,442,310 A | 4/1984 | Carlson et al. |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,502,225 A | 3/1985 | Lin |
| 4,507,181 A | 3/1985 | Nath et al. |
| 4,517,403 A | 5/1985 | Morel et al. |
| 4,518,855 A | 5/1985 | Malak |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,612,411 A | 9/1986 | Wieting et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,705,912 A | 11/1987 | Nakashima et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,793,283 A | 12/1988 | Sarkozy |
| 4,798,660 A | 1/1989 | Ermer et al. |
| 4,816,082 A | 3/1989 | Guha et al. |
| 4,816,420 A | 3/1989 | Bozler et al. |
| 4,865,999 A | 9/1989 | Xi et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,069,727 A | 12/1991 | Kouzuma et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmon et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,259,883 A | 11/1993 | Yamabe et al. |
| 5,261,968 A | 11/1993 | Jordan |
| 5,298,086 A | 3/1994 | Guha et al. |
| 5,336,381 A | 8/1994 | Dalzell, Jr. et al. |
| 5,336,623 A | 8/1994 | Sichanugrist et al. |
| 5,346,853 A | 9/1994 | Guha et al. |
| 5,397,401 A | 3/1995 | Toma et al. |
| 5,399,504 A | 3/1995 | Ohsawa |
| 5,421,909 A | 6/1995 | Ishikawa et al. |
| 5,436,204 A | 7/1995 | Albin et al. |
| 5,445,847 A | 8/1995 | Wada et al. |
| 5,474,939 A | 12/1995 | Pollock et al. |
| 5,482,571 A | 1/1996 | Yamada et al. |
| 5,501,744 A | 3/1996 | Albright et al. |
| 5,512,107 A | 4/1996 | van den Berg |
| 5,528,397 A | 6/1996 | Zavracy et al. |
| 5,536,333 A | 7/1996 | Foote et al. |
| 5,578,103 A | 11/1996 | Araujo et al. |
| 5,578,503 A | 11/1996 | Karg et al. |
| 5,589,006 A | 12/1996 | Itoyama et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,698,496 A | 12/1997 | Fastnacht et al. |
| 5,726,065 A | 3/1998 | Szlufcik et al. |
| 5,738,731 A | 4/1998 | Shindo et al. |
| 5,855,974 A | 1/1999 | Wu et al. |
| 5,858,819 A | 1/1999 | Miyasaka |
| 5,868,869 A | 2/1999 | Albright et al. |
| 5,925,228 A | 7/1999 | Panitz et al. |
| 5,948,176 A | 9/1999 | Ramanathan et al. |
| 5,977,476 A | 11/1999 | Guha et al. |
| 5,981,868 A | 11/1999 | Kushiya et al. |
| 5,985,691 A | 11/1999 | Basol et al. |
| 6,001,744 A | 12/1999 | Doi |
| 6,040,521 A | 3/2000 | Kushiya et al. |
| 6,048,442 A | 4/2000 | Kushiya et al. |
| 6,077,722 A | 6/2000 | Jansen et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,134,049 A | 10/2000 | Spiller et al. |
| 6,160,215 A | 12/2000 | Curtin |
| 6,166,319 A | 12/2000 | Matsuyama |
| 6,169,246 B1 | 1/2001 | Wu et al. |
| 6,172,297 B1 | 1/2001 | Hezel et al. |
| 6,258,620 B1 | 7/2001 | Morel et al. |
| 6,288,325 B1 | 9/2001 | Jansen et al. |
| 6,294,274 B1 | 9/2001 | Kawazoe et al. |
| 6,307,148 B1 | 10/2001 | Takeuchi et al. |
| 6,310,281 B1 | 10/2001 | Wendt et al. |
| 6,323,417 B1 | 11/2001 | Gillespie et al. |
| 6,328,871 B1 | 12/2001 | Ding et al. |
| RE37,512 E | 1/2002 | Szlufcik et al. |
| 6,335,479 B1 | 1/2002 | Yamada et al. |
| 6,361,718 B1 | 3/2002 | Shinmo et al. |
| 6,372,538 B1 | 4/2002 | Wendt et al. |
| 6,380,480 B1 | 4/2002 | Norimatsu et al. |
| 6,423,565 B1 | 7/2002 | Barth et al. |
| 6,537,845 B1 | 3/2003 | McCandless et al. |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,692,820 B2 | 2/2004 | Forrest et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,303,788 B2 | 12/2007 | Kataoka et al. |
| 7,319,190 B2 | 1/2008 | Tuttle |
| 7,364,808 B2 | 4/2008 | Sato et al. |
| 7,441,413 B2 | 10/2008 | Bae et al. |
| 7,442,413 B2 | 10/2008 | Zwaap et al. |
| 7,544,884 B2 | 6/2009 | Hollars |
| 7,576,017 B2 | 8/2009 | Tuttle |
| 7,736,755 B2 | 6/2010 | Igarashi et al. |
| 7,741,560 B2 | 6/2010 | Yonezawa |
| 7,846,750 B2 | 12/2010 | Boyer |
| 7,855,089 B2 | 12/2010 | Farris, III et al. |
| 7,863,074 B2 | 1/2011 | Wieting |
| 7,863,518 B2 | 1/2011 | Terakawa et al. |
| 7,875,945 B2 | 1/2011 | Krasnov et al. |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,017,860 B2 | 9/2011 | Lee |
| 8,026,122 B1 | 9/2011 | Lee |
| 8,142,521 B2 | 3/2012 | Wieting |

| | | |
|---|---|---|
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |
| 8,263,494 B2 | 9/2012 | Patterson |
| 8,287,942 B1 | 10/2012 | Huang et al. |
| 2002/0002992 A1 | 1/2002 | Kariya et al. |
| 2002/0004302 A1 | 1/2002 | Fukumoto |
| 2002/0061361 A1 | 5/2002 | Nakahara |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2003/0188777 A1 | 10/2003 | Gaudiana et al. |
| 2003/0230338 A1 | 12/2003 | Menezes |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0161539 A1 | 8/2004 | Miyakawa |
| 2004/0187917 A1 | 9/2004 | Pichler |
| 2004/0191949 A1 | 9/2004 | Iwata et al. |
| 2004/0191950 A1 | 9/2004 | Nakamura et al. |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 | 9/2005 | Basol |
| 2005/0223570 A1 | 10/2005 | Yonezawa et al. |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1 | 6/2006 | Hantschel et al. |
| 2006/0160261 A1 | 7/2006 | Sheats et al. |
| 2006/0173113 A1 | 8/2006 | Yabuta et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0004078 A1 | 1/2007 | Alberts |
| 2007/0006914 A1 | 1/2007 | Lee |
| 2007/0089782 A1 | 4/2007 | Scheuten et al. |
| 2007/0116892 A1 | 5/2007 | Zwaap et al. |
| 2007/0116893 A1 | 5/2007 | Zwaap et al. |
| 2007/0151596 A1 | 7/2007 | Nasuno et al. |
| 2007/0163643 A1 | 7/2007 | Van Duren et al. |
| 2007/0169810 A1 | 7/2007 | Van Duern et al. |
| 2007/0193623 A1 | 8/2007 | Krasnov |
| 2007/0209700 A1 | 9/2007 | Yonezawa et al. |
| 2007/0243657 A1 | 10/2007 | Basol et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Mishtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0115827 A1 | 5/2008 | Woods et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0216886 A1 | 9/2008 | Iwakura |
| 2008/0280030 A1 | 11/2008 | Van Duren et al. |
| 2008/0283389 A1 | 11/2008 | Aoki |
| 2009/0021157 A1 | 1/2009 | Kim et al. |
| 2009/0058295 A1 | 3/2009 | Auday et al. |
| 2009/0084438 A1 | 4/2009 | den Boer et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0223448 A1* | 9/2009 | Sakai et al. .................. 118/715 |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0087027 A1 | 4/2010 | Wieting |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0224247 A1 | 9/2010 | Bartholomeusz et al. |
| 2010/0233386 A1 | 9/2010 | Krause et al. |
| 2010/0258179 A1 | 10/2010 | Wieting |
| 2010/0267189 A1 | 10/2010 | Yu et al. |
| 2010/0267190 A1 | 10/2010 | Hakuma et al. |
| 2010/0297798 A1 | 11/2010 | Adriani et al. |
| 2011/0018103 A1 | 1/2011 | Wieting |
| 2011/0020980 A1 | 1/2011 | Wieting |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0071659 A1 | 3/2011 | Farris, III et al. |
| 2011/0073181 A1 | 3/2011 | Wieting |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2012/0003789 A1 | 1/2012 | Doering et al. |
| 2012/0018828 A1 | 1/2012 | Shao |
| 2012/0094432 A1 | 4/2012 | Wieting |
| 2012/0122304 A1 | 5/2012 | Wieting |
| 2012/0186975 A1 | 7/2012 | Lee et al. |
| 2012/0270341 A1 | 10/2012 | Lee et al. |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

Chopra et al., "Thin-Film Solar Cells: An Overview", 2004, Progress in Photovoltaics: Research and Applications, 2004, vol. 12, pp. 69-92.

Guillen C., "CuInS$_2$ Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of Zn$_x$Cd$_{1-x}$S Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of CuIn$_{1-x}$Ga$_x$Se$_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Salvador, "Hole diffusion length in $n$-TiO$_2$ single crystals and sintered electrodes: photoelectrochemical determination and comparative analysis," Journal of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/Polymer Composite Doped with Tetraphenylbenzidine Single Layer Structure Light-emitting Diode", Applied Physics Letters, vol. 69, No. 3, Jul. 15, 1996, pp. 377-379.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Gordillo et al. "Electrical and morphological properties of low resistivity Mo thin films prepared by magnetron sputtering," 9Brazilian Journal of Physics 36:982-985 (Sep. 2006).

Grecu et al. "Spectroscopic Characterization of Chemical Bath Deposited Cadmium Sulphide Layers", Journal of Optoelectronics and Advanced Matenals 6:127-132 (Mar. 2004).

Onuma et al., Preparation and Characterization of CuInS Thin Films Solar Cells with Large Grain, Elsevier Science B.V; Solar Energy Materials & Solar Cells 69 (2001) pp. 261-269.

Palm et al. "Second generation CIS solar modules," Solar Energy 77:757-765 (Dec. 2004).

Scofield "Sodium diffusion, selenization, and microstructural effects associated with various molybdenum back contact layers for CIS-based solar cells" , Proceedings of the 24th IEEE Photovoltaic Specialists Conference, pp. 164-167 (1995).

* cited by examiner

QUARTZ BOAT METHOD AND APPARATUS FOR THIN FILM THERMAL TREATMENT

CROSS-REFERENCE TO RELATED APPLICATION

This application claims priority to U.S. Provisional Application No. 61/367,211, filed Jul. 23, 2010, commonly assigned, and hereby incorporated by reference in its entirety herein for all purpose.

BACKGROUND OF THE INVENTION

The present invention relates generally to photovoltaic materials and manufacturing method. More particularly, the present invention provides a method and apparatus for thin film thermal treatment. Embodiments of the invention include a method and apparatus for holding a plurality of extra large substrates for achieving substantially uniform substrate temperature during a thermal process to form a photovoltaic absorber material, but it would be recognized that the invention may be applied for other thin-film treatment applications.

From the beginning of time, mankind has been challenged to find ways of harnessing energy. Energy comes in forms such as petrochemical, hydroelectric, nuclear, wind, biomass, solar, and more primitive forms such as wood and coal. More recently, environmentally clean and renewable source energy has been desired. Clean and renewable sources of energy also include wind, waves, biomass, and the like. Still other types of clean energy include solar energy.

Solar energy technology generally converts electromagnetic radiation from the sun to other forms of energy. These other forms of energy include thermal energy and electrical power. For electrical power applications, solar cells are often used. Although solar energy is environmentally clean and has been successful to a point, many limitations remain before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation to electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

As an effort to improve thin film solar cell technology, processes of manufacturing an advanced CIS and/or CIGS based photovoltaic film stack on sized substrates with planar, tubular, cylindrical, circular or other shapes have been introduced. There are various manufacturing challenges in forming the photovoltaic film stack, such as maintaining structure integrity of substrate materials, controlling chemical compositions of the ingredients in one or more precursor layers, carrying out proper reactive thermal treatment of the one or more precursor layers within a desired gaseous environment, ensuring uniformity and granularity of the thin film material during reactive thermal treatment, etc. Especially, when manufacturing the thin film based solar cell on large sized substrate, temperature uniformity across whole substrate surface is desired. While conventional techniques in the past have addressed some of these issues, they are often inadequate in various situations. Therefore, it is desirable to have improved system and method for processing thin film photovoltaic devices on planar or non-planar shaped, fixed or flexible substrates.

BRIEF SUMMARY OF THE INVENTION

This invention provides a method and apparatus for holding large substrates with precursor material for thermal treatment. The method and apparatus provide an improved loading configuration for a plurality of substrates during thermal processes for manufacture of thin film based photovoltaic devices.

This invention provides a method of holding a plurality of planar substrates for thermal treatment in a tube shaped furnace having a first end and a second end. The tube shaped furnace is surrounded by heaters for conducting a thermal treatment process. The first end has a door and the second end is insulated. The method further includes providing a boat fixture having a base frame coupled to a top frame. The base frame includes two length portions and a first width portion, a second width portion, and one or more middle members connected between the two length portions. A grooved rod is mounted respectively on the first width portion, the second width portion, and each of the one or more middle members. The substrates are placed in the boat fixture so that the grooves support spaced-apart planar substrates by a desired distance. The boat fixture is loaded via a rack fixture into the tube shaped furnace for the thermal treatment process.

The method includes a substrate arrangement where each substrate is inserted alone in one groove without a front/back phase configuration, and with a minimum spacing between any neighboring substrates at least equal to a desired value, e.g. about 1 inch.

In another embodiment, the loading configuration includes a substrate arrangement where each substrate is inserted alone in one groove with a front/back surface of any substrate directly faces another front/back surface of a neighboring substrate inserted in another groove at a desired spacing.

In yet another embodiment, the loading configuration includes replacing each first grooved rod on the base frame by a second grooved rod mounted on the first width portion, the second width portion, and each of the one or more middle members. Each second grooved rod includes a second plurality of grooves in a second spatial configuration.

In an alternative embodiment, the present invention provides an apparatus for holding one or more substrates for thermal treatment. The apparatus includes a frame fixture having a substantially rectangular prism shape including a base frame, a top frame, one or more side connection bars coupled the base frame and the top frame. The base frame has two width members and one or more middle joint members connected between two length members. The apparatus further includes a first grooved rod removably mounted on each of the two width members and each of the one or more middle joint members. Each first grooved rod includes a first plurality of grooves respectively configured to support a plurality of planar substrates in a first configuration. Additionally, the apparatus includes a first grooved bar removably mounted on each of two width members of the top frame. Each first grooved bar includes a second plurality of grooves respectively aligned with the first plurality of grooves for guiding the plurality of planar substrates. Furthermore, the apparatus includes a rack structure configured to be a mechanical support of the frame fixture in a loading position inside a furnace for subjecting the plurality of planar substrates in the first configuration to one or more reactive thermal treatment processes.

In yet another alternative embodiment, the present invention provides a method for processing substrates through thermal treatments with each of their temperature difference being controlled to within 15 degrees Celsius at least during a dwell stage between ramping up or down stages. Moreover, the furnace provides an enclosed volume for subjecting a precursor film containing at least copper and indium species overlying one surface of each substrate to a gaseous selenium or sulfur species to produce a photovoltaic absorber for solar cell.

The invention provide an apparatus for holding a plurality of planar substrates overlaid with photovoltaic precursor layers in a furnace tube. The furnace tube has heaters to supply heat energy in a controlled manner. The furnace can be filled with desired gaseous species including selenium and/or sulfur for a reactive thermal treatment of the precursor layer for manufacture of photovoltaic cells. In particular, the apparatus utilizes a quartz boat fixture having a rack fixture configured with a plurality of grooves for supporting large planar (rectangular or square in most cases) glass substrates. Some embodiments of the invention provide loading configurations of a plurality of planar substrates in the boat fixture by aligning them vertically, arranging the plurality of grooves with a proper size for each one, and disposing them with an optimum spacing between each other and in periodic groups, and others. In some embodiments, the loading configurations of the substrates in the quartz boat fixture allow an effective convection flow in between the planar substrates to transfer heat energy from hotter regions to cooler regions of the each substrate during the reactive thermal treatment process.

In a specific embodiment, the temperature across each substrate is maintained substantially uniform or at least the temperature difference is controlled to be smaller than a set value. In another specific embodiment, an alternative loading configuration includes two substrates being inserted in each groove in a back-to-back manner with respective precursor layer exposed at front surface. The precursor layer of one of the two planar substrates loaded in a first groove faces the precursor layer of one of two planar substrates loaded in a neighboring groove at a predetermined distance away from one side, while the precursor layer of another one of the two planar substrates in the first groove faces the precursor layer of one of two planar substrates loaded in a neighboring groove at the predetermined distance away from an opposite side. Therefore, the number of planar substrates loaded in the quartz boat fixture is increased compared to loading one substrate only to one groove without reducing the spacing between the subjected surfaces of neighboring substrates. In a specific embodiment, the predetermined distance between the neighboring substrates is associated with the furnace tube configuration, the dimension of the substrates, the gap distance between the loaded substrates and inner wall of the furnace tube, as well as the one or more thermal treatment processes. For example, the furnace is made as tube shape for facilitating gaseous convection flow therein. The furnace tube is made of quartz material which is semi-transparent to thermal radiation from several zoned heaters around tube with temperature control for different regions. Coolers also can be added for easily ramping furnace temperature down as desired in certain stages of the thermal treatment process.

DETAILED DESCRIPTION OF THE INVENTION

Figure 1:
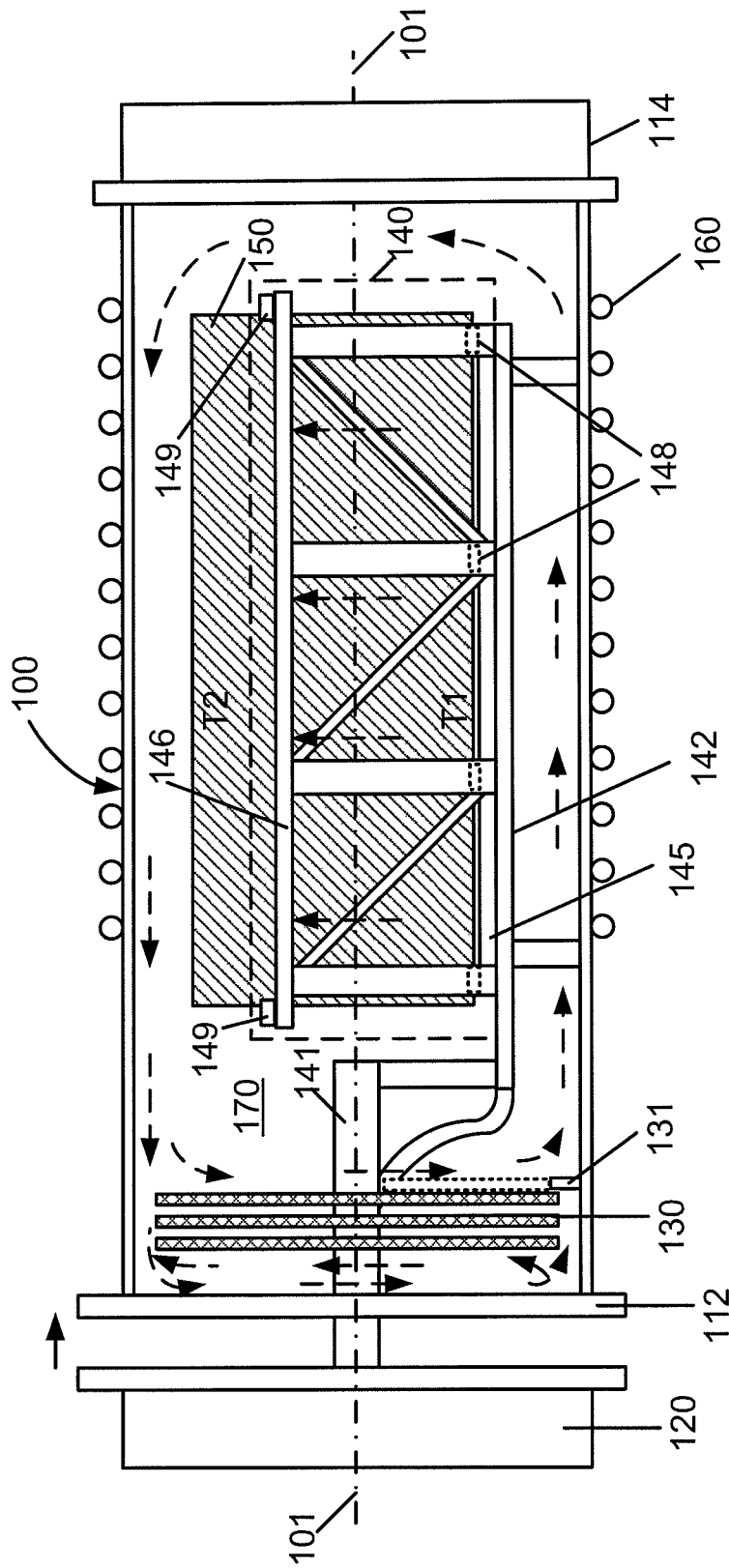
FIG. 1 is a side view along an axis of a furnace tube including a quartz boat fixture with loaded planar substrates for manufacture of photovoltaic cells.

FIG. 1 is a side view along an axis of a furnace tube including a quartz boat fixture with loaded planar substrates for manufacture of photovoltaic cells according to an embodiment of the present invention. As shown, the furnace tube 100 is characterized by a length of tubular shaped container or chamber enclosing a volume of space. In an embodiment, the furnace tube 100 has a first end 112 that is configured to be engaged, covered, and sealed by a cover member (or a door) 120 and a second end 114 on the opposite side. The inner wall of the furnace tube 100 is a smooth surface for facilitating internal gas convection during thermal process. In another embodiment, the furnace tube 100 is set up in an orientation with its tube axis 101 along horizontal (or floor) direction. The second end 114 can be also opened and usually is thermally insulated. A gas supply device and/or a gas monitor (not shown) can be coupled to the furnace tube 100 for providing a controllable gaseous environment required for conducting one or more reactive thermal treatments of any work samples loaded in the furnace tube 100. A plurality of heaters 160 are wrapped around the furnace tube for providing radiation heat required for the thermal treatments. The volume of space 170 of the furnace tube 100, depending on its diameter and length, allows the boat fixture 140 with inserted substrates to be loaded into the furnace tube 100 and is supported by a rack fixture 142.

The boat fixture 140 can hold a plurality of planar substrates 150 for thermal treatment within the furnace tube 100. For example, 40 or more numbers of planar rectangular shaped substrates can be held in the boat fixture 140 at one time. Each planar substrate can have a dimension of a few tens of centimeters in width and more than 100 centimeters in length. Glass substrates with 65 cm×165 cm rectangular shape are used for manufacture of thin-film photovoltaic cells. In certain applications, smaller sized substrates in dimensions of about 20 cm×20 cm, or 20 cm×50 cm, or other form factors, can be loaded with a slight modification of the loading configuration of the boat fixture. During the thermal treatment processes, a temperature uniformity of the substrate usually is a key process parameter. As a simple indicator of the temperature uniformity, a temperature difference across the substrate, i.e., $\Delta T = T1 - T2$ can be monitored, where T1 represents a temperature near bottom region of the substrate and T2 represents a temperature near top region of the substrate. Of course, more complete temperature mapping over a whole surface may be needed.

In an alternative embodiment as illustrated in FIG. 1, the invention also provides a method for forming a flexible loading configuration of a plurality of planar substrates in a furnace. As shown, the boat fixture 140, which is removably supported onto the rack fixture 142, is configured to load a plurality of planar substrates 150 substantially in a vertical orientation along the gravity direction. In a specific embodiment, the boat fixture 140 is made of quartz or other material being both a good thermal conductor and an electrical insulator. Throughout this specification, it is also directly referred to be a quartz boat, although it does not intend to limit the choice of materials for the boat fixture 140. In another specific embodiment, the boat fixture 140 can be loaded in and out through the first end 112. A rack member 141 can be used to couple the boat fixture 140 to a loader (not shown) when the cover member 120 is opened and load the boat fixture from the loader or unload the boat fixture back to the loader.

In a specific embodiment, the boat fixture 140 has a base frame 145 and a top frame 146, although only side view is shown in FIG. 1. The boat fixture 140 includes several grooved rods 148 removably mounted on the base frame 145 and two grooved bars 149 removably mounted on the top frame 146. Each grooved rod 148 includes a plurality of grooves or slots spatially aligned for respectively supporting a plurality of planar substrates 150. The two grooved bars 149 also have the corresponding plurality of grooves for providing guide to the loaded substrates 150. In an embodiment, each groove is disposed an equal spacing away from its neighboring groove and each groove has a size fit for support at least one substrate. In another embodiment, each grooved rods 148 or each grooved bars 149 can be replaced by another set of grooved rods or grooved bars which contain grooves in an alternative configuration with either a different groove spacing or groove spacing and groove size combination. For example, in a configuration a groove may have a first spacing from its left neighboring groove while a second spacing from its right neighboring groove. Further, each groove may have a bigger groove size for holding two planar substrates in a back-to-back configuration. In an alternative embodiment, each of the plurality of planar substrates 150 in substantially vertical orientation and parallel to each other as the quartz boat fixture 140 is loaded into the furnace tube 100, provided that the tube axis 101 is set along a horizontal direction. Of course, there are many other variations, modifications, and alternatives.

Additionally, FIG. 1 also shows one or more baffles 130 and 131 being placed between the first end 120 (with a door) and the loaded quartz boat fixture 140. The baffles are used for controlling the convection flow and keeping the heated gases being substantially circulated around the spatial region occupied by the loaded substrates instead being lost to relative cold door 130. Further a crescent shaped baffle 131 is disposed to a lower portion position of the furnace tube 100 for blocking the colder gases return to the substrate spatial regions. The crescent shaped baffle 131 is made of quartz and has a curved body with a height and a curvature substantially similar to that of the inner wall. In an embodiment, the crescent shaped baffle can have an arc length about one half of an inner perimeter of the furnace tube or less. In another embodiment, the crescent shaped baffle can have an arc length about $2/3$ of an inner perimeter of the furnace tube or less. In another embodiment, the crescent shaped baffle can have an arc length ranging from one half to about $2/3$ of an inner perimeter of the furnace tube 100. In an embodiment, the height and the arc length are parameters adjustable for achieving desired adjustment to the convection flows or currents passed by.

As used herein, the "crescent" means a "shape produced when a circular disk has a segment of another circle removed from its edge, so that what remains is a shape enclosed by two circular arcs of different diameters which intersect at two points," although there can be variations, modifications, and alternatives, according to one or more embodiments. For example, some descriptions or definitions can be found in public information website such as http://en.wikipedia.org/wiki/Crescent. As an example, the term can include one or more crescent shaped members, although there can also be partial crescent shaped members.

As used herein, "top", "bottom", "open", "close", have their plain meanings for illustrating the configuration used in the exemplary figures in the specification and should not be treated as a claimed limitation. Similarly, the terms "lower" and/or "upper" are to be interpreted by ordinary meaning, and do not have any specific reference regarding to the direction of gravity according to one or more embodiments. In some embodiments, the terms lower and/or upper can be reference to gravity, although there can be some general variations, modifications, and alternatives.

Referring to FIG. 1, utilizing the loading configuration according to the embodiments of the present invention a plurality of planar substrates 150 can be loaded into the furnace tube 100. In an embodiment, each of the plurality of planar substrates is a panel of glass. In an example, the substrate can be a 20 cm×20 cm square shaped glass panel or a 20 cm×50 cm rectangular shaped glass panel. In another example, the substrate can be a 65 cm×165 cm rectangular shaped glass panel, though any other form factors are not excluded. Specifically, the substrate is a soda lime glass which is widely used as a transparent substrate panel for thin-film solar module. In other embodiments, the substrate can be made of other transparent materials including fused silica, quartz, and others. In some embodiments, the substrates with other shapes including planar rectangular, square, and disk, and non-planar cylindrical rod, tube, semi-cylindrical tile, or even flexible foil can be used depending on applications.

In an embodiment, on each of the plurality of planar substrates one or more over layers has formed on a front surface through some thin-film processes. For example, a precursor layer including copper species, indium species, and/or indium-gallium species may be formed on the front surface of each substrate using a sputtering technique. The substrates are then loaded into the furnace tube for subjecting the precursor layer to subsequent thermal treatment. In an embodiment, the precursor layer can be reactively treated in a gaseous environment within the furnace tube containing selenide species, or sulfide species, and nitrogen species, etc. When the furnace tube temperature is ramped up the substrates are heated and so do the working gases within the furnace tube. The heated gaseous selenium species, which may flow around following internal convection flow, react with the copper-indium-gallium species in the precursor layer overlying the substrates. The thermal treatment process may include several steps for temperature ramping up, dwelling, and ramping down. As a result of the reactive process, the precursor layer is transformed to a photovoltaic film stack containing copper indium (gallium) diselenide (CIGS) compound, which can be served as an absorber layer of a thin-film photovoltaic cell. More detail descriptions about the thermal treatment process for forming the CIGS photovoltaic film stack of thin film solar cells can be found in U.S. Patent Application No. 61/178,459 titled "Method and System for Selenization in Fabricating CIGS/CIS Solar Cells" filed on May 14, 2009 by Robert Wieting, commonly assigned to Stion Corporation of San Jose and hereby incorporated by reference.

Figure 2:
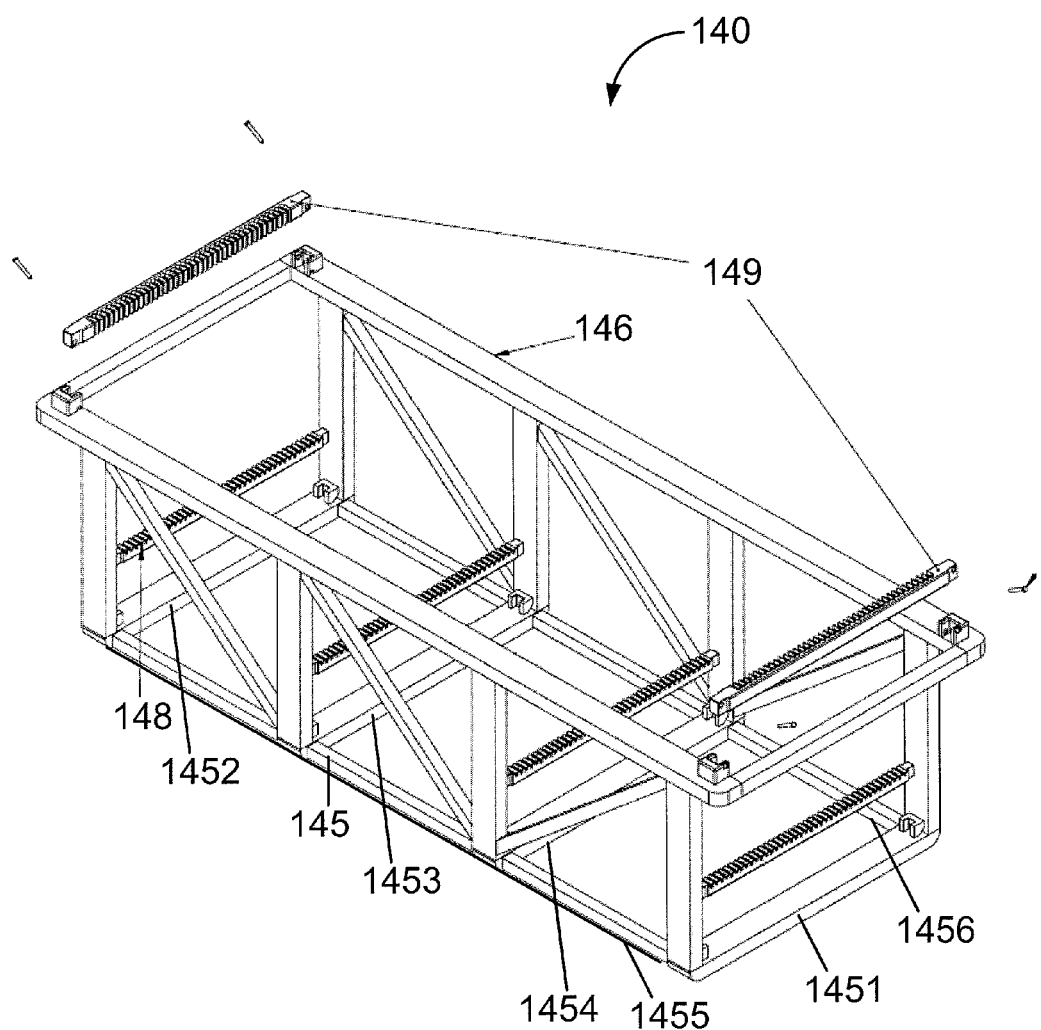
FIG. 2 is a perspective view of the quartz boat fixture for loading a plurality of planar substrates.

In another embodiment, each of the plurality of planar substrates is disposed into the quartz boat fixture 140 in a loading configurations. The loading configurations can be customized using a few grooved rods or bars mounted on a frame structure of the quartz boat fixture. FIG. 2 is a perspective view of the quartz boat fixture for loading a plurality of planar substrates according to an embodiment of the present invention. As shown, the boat fixture 140 is a frame fixture having a substantially rectangular prism shape, including a base frame 145 and a top frame 146, the base frame 145 and the top frame 146 being fixedly coupled by several side connection bars. The base frame 145 has a first width portion 1451, a second width portion 1452, and one or more middle members 1453, 1454 connected between two length portions 1455 and 1456. Each grooved rod 148 is installed on each of the first width portion 1451, the second width portion 1452, and one or more middle members 1453, 1454 of the base frame 145. As shown, each grooved rod 148 includes a plurality of grooves, presumably facing upward, disposed in a certain configuration along the length of rod. In particular, each groove is configured to support one or more pieces of glass substrates. The four grooved rods 148 are aligned so that one groove from each grooved rod is just in position to insert at least one planar substrate. In the implementation, each loaded planar substrate sits in the four grooves of the respective grooved rods substantially in a vertical orientation in parallel to the gravity direction and all loaded planar substrates are substantially in parallel to each other. In addition, two grooved bars 149 are installed respectively at each width member of the top frame 146. Each grooved bar 149 also has a plurality of grooves with substantially the same configuration as those on the grooved rods 148 and is aligned with corresponding groove of the grooved rods 148. The grooved bars have their facing mainly inward to provide guides to the loaded planar substrates. For example, a quartz boat fixture designed to load a plurality of planar substrates substantially in a horizontal orientation perpendicular to the gravity direction can be an alternative option, using grooved rods or grooved bars mounted on the side connection bars as substrate support and guide.

Figure 3:
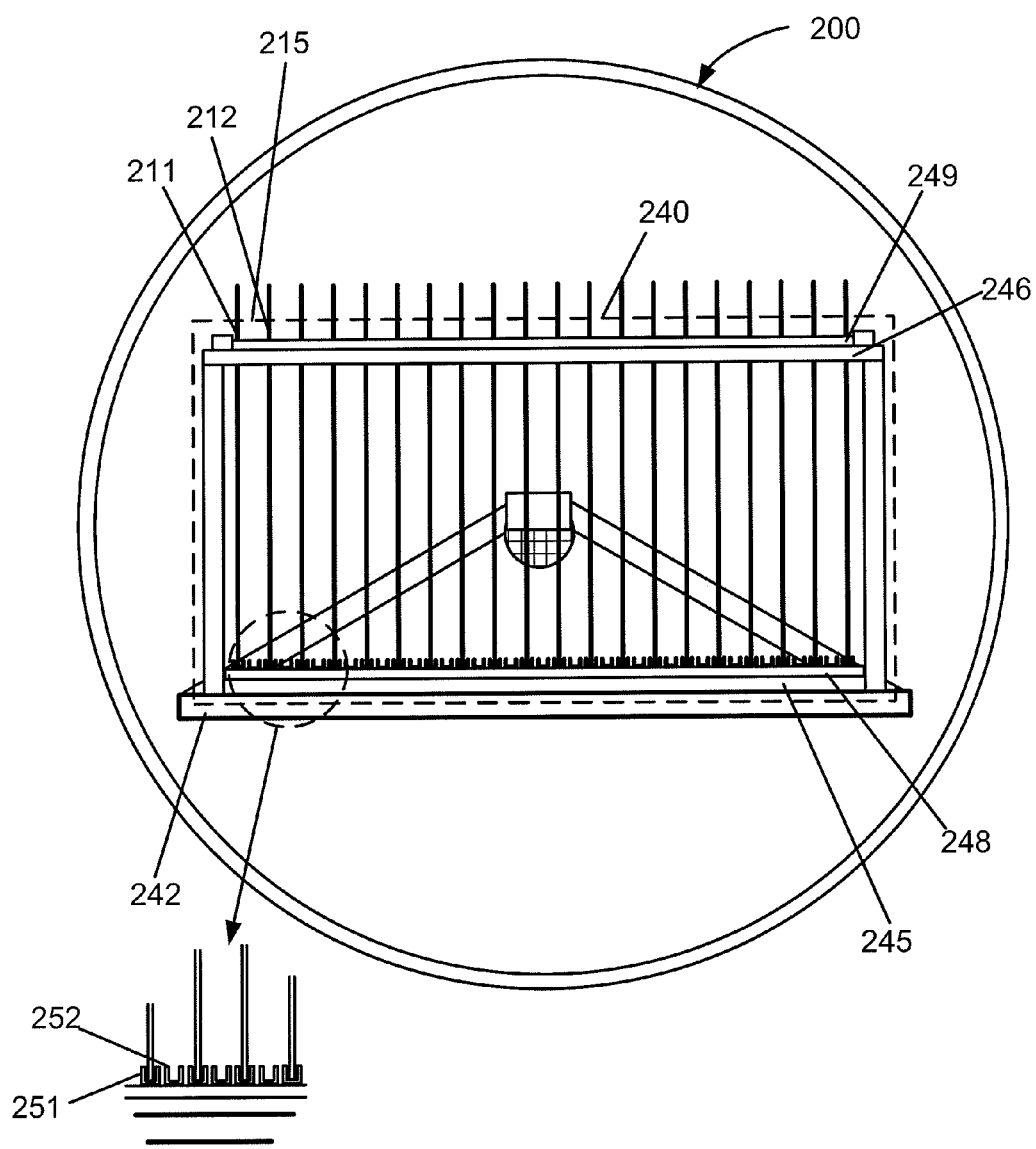
FIG. 3 is a side view from the closed end of the furnace tube loaded with a quartz boat fixture holding a plurality of planar substrates.

FIG. 3 is a simplified side view of the furnace tube loaded with a quartz boat fixture holding a plurality of planar substrates according to an embodiment of the present invention. As shown, a plurality of planar substrates 211, 212, etc. is inserted respectively in a plurality of grooves 251, 252, etc. in a specific configuration within a quartz boat fixture 240 according to an embodiment of the present invention. In particular, the plurality of grooves is disposed with an equal spacing for each neighboring groove. Although each groove has a size for supporting at least one substrate, only every other groove is used for one substrate to be loaded in a vertical orientation while leaving one groove in between empty. For example, groove 251 supports a substrate 211 and the groove 252 is empty, while next groove supports a next substrate 212 and so on. In certain embodiments, number of empty grooves may be greater than one. As the plurality of planar substrates 211, 212 etc. are inserted into the quartz boat fixture 240 in the loading configuration described above, a spacing 215 is provided for every neighboring substrates. The quartz boat fixture 240 is then loaded into the tube shaped furnace 200.

In an embodiment, the present invention provides a method for loading planar substrates in a predetermined configuration. Firstly, the method provides a plurality of equally spaced grooves. Secondly, the method provides inserting the planar substrates into the grooves with an increased spacing 215 between two neighboring planar substrates beyond that of two neighboring grooves by intentionally skipping one or more grooves. When the plurality of planar substrates in this loading configuration is subjected to a reactive thermal treatment within a gaseous environment inside the tube shaped furnace 200, the advantage of having a relative wide spacing 215 between two neighboring substrates is to have sufficient spatial room for vertical convection flow. In a specific embodiment with the substrates in vertical orientation, the hotter work gas within the furnace tube 200 is carried by the convection flow upwards while colder gas flows down along the substrate surfaces. Wider spacing between the planar substrates can facilitate the interflowing which helps to improve temperature uniformity of each loaded substrate, especially during quick temperature ramping up or down processes. For example, when the substrates are heated from relative low temperatures which are increased in a ramping-up process via the plurality of heaters (not shown) associated with the furnace tube 200, convection in between the substrates plays more important role in heat transfer than radiation. At higher temperatures radiation will dominate convection and major heat transfer within the substrate is not highly dependent on substrate spacing. In another example, the larger substrate spacing naturally reduces the total number of substrates loadable with a fixed dimension of the furnace tube 200. Therefore, substrate spacing may need to be optimized and predetermined. Once a desired spacing between substrates is determined the corresponding grooves pattern can be built into the grooved bar or grooved rod just for installing onto the boat fixture for loading substrates in a desired configuration.

In alternative embodiments, other parameters affecting the effectiveness of heat transfer or subsequently the substrate temperature uniformity include time (or heater/cooler ramping rate) and thermal mass or total number of the loaded substrates. These parameters are also interrelated. For example, when total number of substrates is increased for seeking higher production yield, it actually demands a wider substrate spacing 215 for effective convection flow which ends up reducing the total number of substrates loadable. For the substrates with dimensions as large as 65×165 cm, high temperature difference ($\Delta T$) can lead to warping and breaking of the substrate. A uniform temperature is desired for uniformity of thin-film process, precursor reactions, and of course, better performance of the devices. For example, a $\Delta T$ less than 15 degrees Celsius may be desired during dwell stage of the thermal treatment process while the $\Delta T$ may become as large as 100 degree Celsius during ramping up/down stage if the ramping rate is high. Therefore, one or more embodiments of the present invention include using a simulation model to determine a trend of changing the loading configuration and how it affect the temperature uniformity. In an embodiment, the model is scaled down from a real system by using a smaller substrate and furnace size in order to reduce the computation time. The substrates in the model are 20 cm×50 cm instead of the full size of 65 cm×165 cm. The substrate thickness and spacing are also correspondingly scaled, and totally only 16 substrates are fit in the model with their substrate spacing set at a range from 0.5 inches to several inches. The time scale is substantially reduced so that the ramp rates can be faster than the real system. The behavior trends of this model closely track those of the full size system, although absolute values of temperatures across the substrates may be off the true values from a real system. For example, the scaled system is simulated for the tube shaped furnace 200 loaded with a quartz boat 240 including the grooved rods 248 and grooved bars 249 having a specific groove configuration with a selected spacing. This simulation model can be used as a guide for the real system implementation and finally help to determine an optimized loading configuration for a specific number of substrates. In a specific implementation, a "Computational Fluid Dynamics (CFD)" software is used for analyzing the convection fluid flow and computing heat transfer response of a simulation model system based on the scaled structure parameters. In particular, a commercially available program named CFdesign™ by Blue Ridge Numerics, Inc. is applied by adjusting input parameters for system, materials, boundary, and initial conditions. Of course, other general purpose computational fluid dynamics simulation software may be used.

Figure 4:
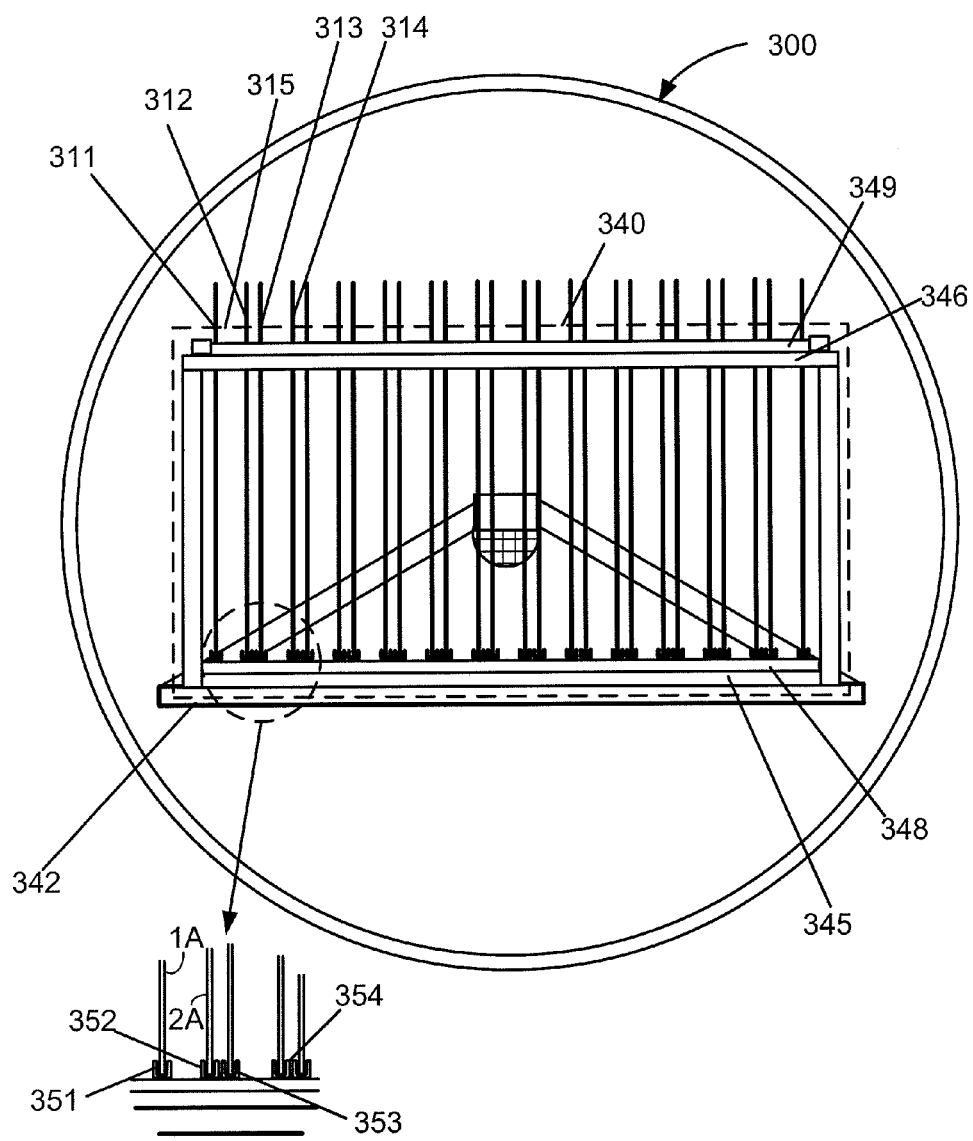
FIG. 4 is a side view of the furnace tube loaded with a quartz boat fixture holding a plurality of planar substrates.

FIG. 4 is a simplified side view of the furnace tube loaded with a quartz boat fixture holding a plurality of planar substrates according to an alternative embodiment of the present invention. This diagram is merely an example and should not unduly limit the claims herein. One skilled in the art would recognize other variations, modifications, and alternatives. As shown, a plurality of planar substrates 311, 312, etc. are inserted respectively in a plurality of grooves 351, 352 etc. in a specific configuration within a quartz boat fixture 340 according to an embodiment of the present invention. In an implementation, the quartz boat fixture 340 loaded in the furnace tube 300 is substantially the same as the quartz boat fixture 240 loaded in furnace tube 200 except that the grooved rods 348 for supporting the substrates and grooved bars 349 for guiding the substrates are replaced from grooved rods 248 and grooved bars 249. Embodiment illustrated in FIG. 4 also provides a method for loading a plurality of planar substrates in an alternative configuration. In particular, this loading configuration can provide improved production yield by increasing total number of the substrates while still retaining sufficient substrate spacing for facilitating internal convection without any structural changes to the dimension of the furnace tube 300 and rack fixture 345, 346 of the quartz boat 340.

In a specific embodiment, the plurality of grooves is arranged in a periodic group in this alternative loading configuration. Each group includes at least a first groove and a second groove being disposed at a predetermined spacing away from the first groove. The spacing in between can be smaller, equal to, or greater than a size of a single groove. Each group is disposed to be physically next to its neighboring group so that the first groove of the group is next to a second groove of its neighboring group on one side and the second groove of the group is next to a first groove of its neighboring group on another side. Each groove is configured to let one substrate being inserted. For example, a substrate 311 is inserted in the first groove 351 of the first group and substrate 312 is inserted in the second groove 352 of the group with a spacing 315 away from the substrate 311. The spacing 315 is substantially determined by the spacing between the first groove 351 and second groove 352. In addition, the first groove 353 of a very next group is disposed physically next to the second groove of the first group. Arranged in periodic fashion, the second groove 354 of the very next group is also disposed at the spacing away from the first groove 353. Correspondingly, each groove of the very next group can be inserted in a substrate 313 (in groove 353), or a substrate 314 (in groove 354).

In another specific embodiment, the loading configuration described in FIG. 4 includes a specific front/back phase configuration for each planar substrate inserted in corresponding the first and the second groove of each of the periodic groups of grooves. In an implementation, each substrate is a planar glass substrate that has been worked through one or more thin-film processes. The planar glass substrate has a front surface overlaid by a thin-film composite material while its corresponding back surface can be a bare glass. In an example, the thin-film composite material is a photovoltaic precursor film containing at least cooper species, indium species, and/or gallium species, or silver species. Therefore, an embodiment of the present invention includes inserting two such planar substrates respectively into each group with their photovoltaic precursor film on each substrate directly facing each other. For example, surface 1A of substrate 311 contains a photovoltaic precursor film which faces a photovoltaic precursor film formed on surface 2A of substrate 312. The back surface of substrate 312 faces a back surface of another substrate 313 inserted in a first groove 353 of a neighboring group. Because chemical reaction between the precursor film and ambient work gas inside the furnace 300 will occur only on the front surface of each substrate, only the convection flow between those front surfaces of two planar substrates matters while any convection flow between the back sides is less important. Embodiment of the present invention associated with this loading configuration includes further determining a minimum front surface spacing between two substrates inserted in each group. This also can be accomplished using a simulation model based on a system and substrates with scaled-down dimensions to determine a temperature trend of change following the spacing change. The simulation model is executed using a class of software program named CFdesign™ based on the scaled system structure and material parameters. Via the simulation, a range of desired spacing values can be determined so that the corresponding groove patterns can be built into each of the grooved rods 348 and grooved bars 349. Then these grooved rods and bars can be mounted to customize a standard quartz boat fixture 340 for loading a plurality of substrates in this new loading configuration. One advantage of this loading configuration is the total number of substrates loadable for a fixed quartz boat size is increased comparing to inserting substrates with a simple equal spacing but without front/back phase configuration. Of course, there can be many variations, alternatives, and modifications.

Figure 5:
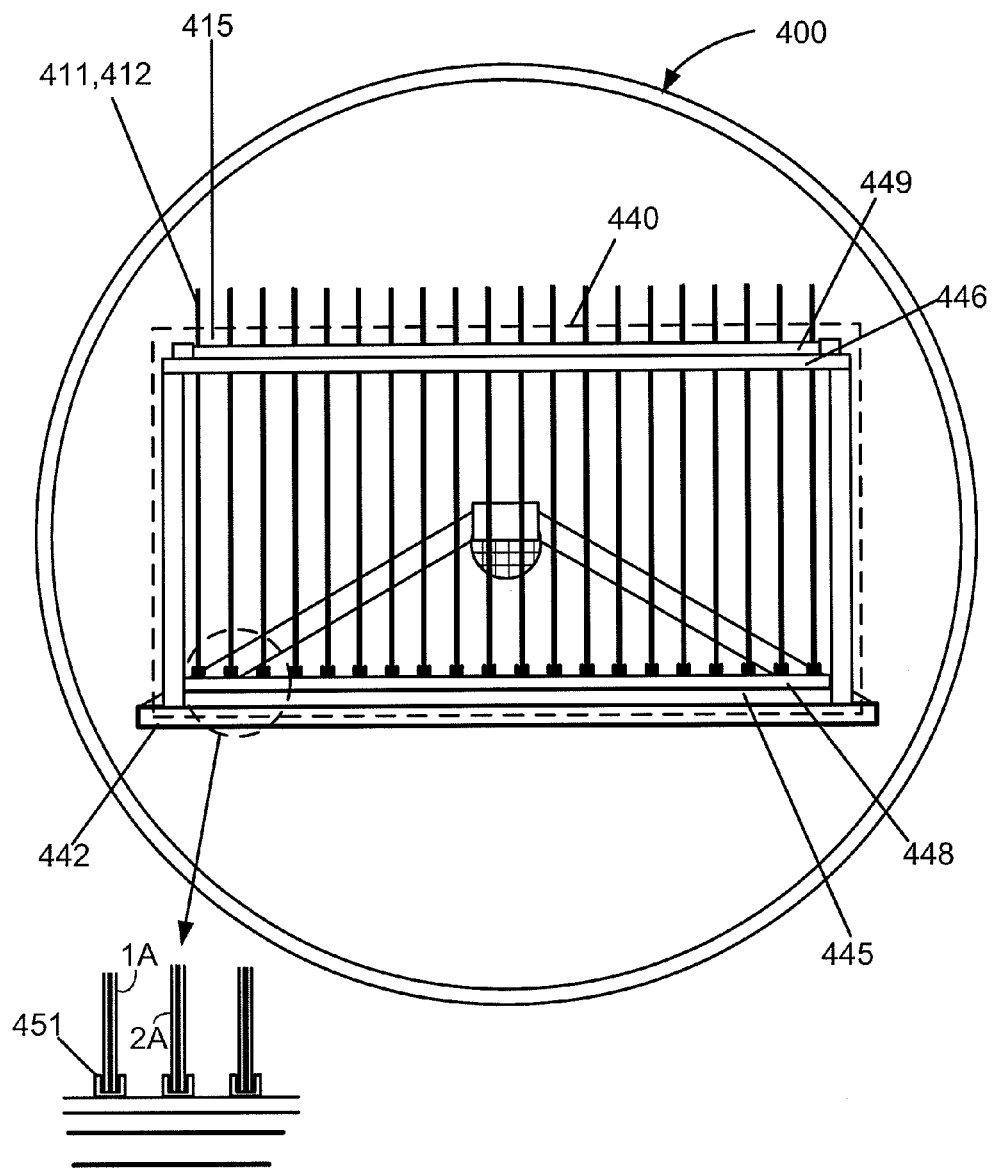
FIG. 5 is a side view of the furnace tube loaded with a quartz boat fixture holding a plurality of planar substrates.

FIG. 5 is a side view of the furnace tube loaded with a quartz boat fixture holding a plurality of planar substrates according to another alternative embodiment of the present invention. As shown, a plurality of planar substrates 411, 412, etc. are inserted in a plurality of grooves 451 in a pairwise back-to-back configuration within a quartz boat fixture 440 according to an embodiment of the present invention. In an implementation, the quartz boat fixture 440 loaded in the furnace tube 400 is substantially the same as the quartz boat fixture 240 loaded in furnace tube 200 except that the grooved rods 448 for supporting the substrates and grooved bars 449 for guiding the substrates are replaced from grooved rods 248 and grooved bars 249. Embodiment illustrated in FIG. 5 also provides a method for loading a plurality of planar substrates in an alternative configuration. In particular, this loading configuration can provide further improved production yield by increasing total number of the substrates while still retaining sufficient substrate spacing for facilitating internal convection without any structural changes to the dimension of the furnace tube 400 and frames 445, 446 of the quartz boat fixture 440.

In a specific embodiment, each of the plurality of grooves 451 is configured to be able to fit in a pair of planar substrates in a back-to-back loading configuration. In a specific embodiment, the spacing is a single constant for all neighboring grooves, although it can be varied along the grooved rod or bar from its end to its middle. Again, in this configuration the substrate loading is performed with its front/back phase configured. Depending on embodiments, each substrate 411 can be a glass panel for manufacturing photovoltaic cells. In one implementation, the glass substrate has a front surface being covered by several films of materials including a precursor layer formed on top while leaving its back surface a bare glass. A plurality of these substrates is loaded in the furnace tube fixture 400 for subjecting the precursor layers to one or more reactive thermal treatment processes and forming a photovoltaic absorber. Therefore, only front surface of each planar substrate with the precursor layer on top needs to be exposed to ambient reactive gas within the furnace tube and the back side of the same substrate can be physically touched with another back side of another substrate, and both these two substrates can be inserted into a single groove (with a enlarged size). For example, substrate 411 and substrate 412 are inserted together in a back-to-back configuration into a first groove. A second groove is disposed a distance away from the first groove. The front side 1A of substrate 412 would be facing front side 2A of another one of two substrates that are inserted back-to-back together in the second groove. The groove-to-groove spacing is configured to be sufficiently large so that the substrate spacing 415 (i.e., 1A-2A spacing) is equal to or greater than a predetermined value. Because of the thermal process involves chemical reaction between solid phase film material (the precursor layer) on the substrates and gaseous phase material filled in the furnace tube, larger spacing between those vertically disposed substrates can facilitate convection flow in between during the reactive thermal treatment processes. This specific configuration minimizes the back-back spacing (substantially equal to zero) so that more spatial room is provided for increasing front-front spacing 415 between two substrates disposed in neighboring grooves and for loading more substrates in such a configuration.

In another specific embodiment, the loading configuration described in FIG. 5 includes a specific front/back phase configuration for each substrate and an additional specific size configuration for each groove to fit with just two substrates. Furthermore, embodiment of the present invention associated with this loading configuration includes further determining a minimum front-front spacing between two substrates respectively inserted in two neighboring grooves. This still can be accomplished using a simulation model based on a system and substrates with scaled-down dimensions to determine a temperature uniformity trend of change following the change of the front-front spacing. The simulation model is executed using a computational fluid dynamics software, for example, a program named CFdesign™ provided by Blue Ridge Numerics, Inc., based on the scaled system parameters. Through the simulation, a range of desired spacing values can be determined so that the corresponding groove patterns can be built into each of the grooved rods 448 and grooved bars 449. Then these grooved rods 448 and bars 449 can be mounted to customize a standard quartz boat 440 for loading a plurality of planar substrates 411 and 412 in the corresponding configuration. One advantage of minimizing the front-front spacing is to maximize total number of substrates loadable for a fixed quartz boat size. An example is to set the substrate spacing as one single value for all the inserted substrates, although the spacing can be varied from one side of the quartz boat to another side. Of course, there can be many variations, alternatives, and modifications.

Figure 6:
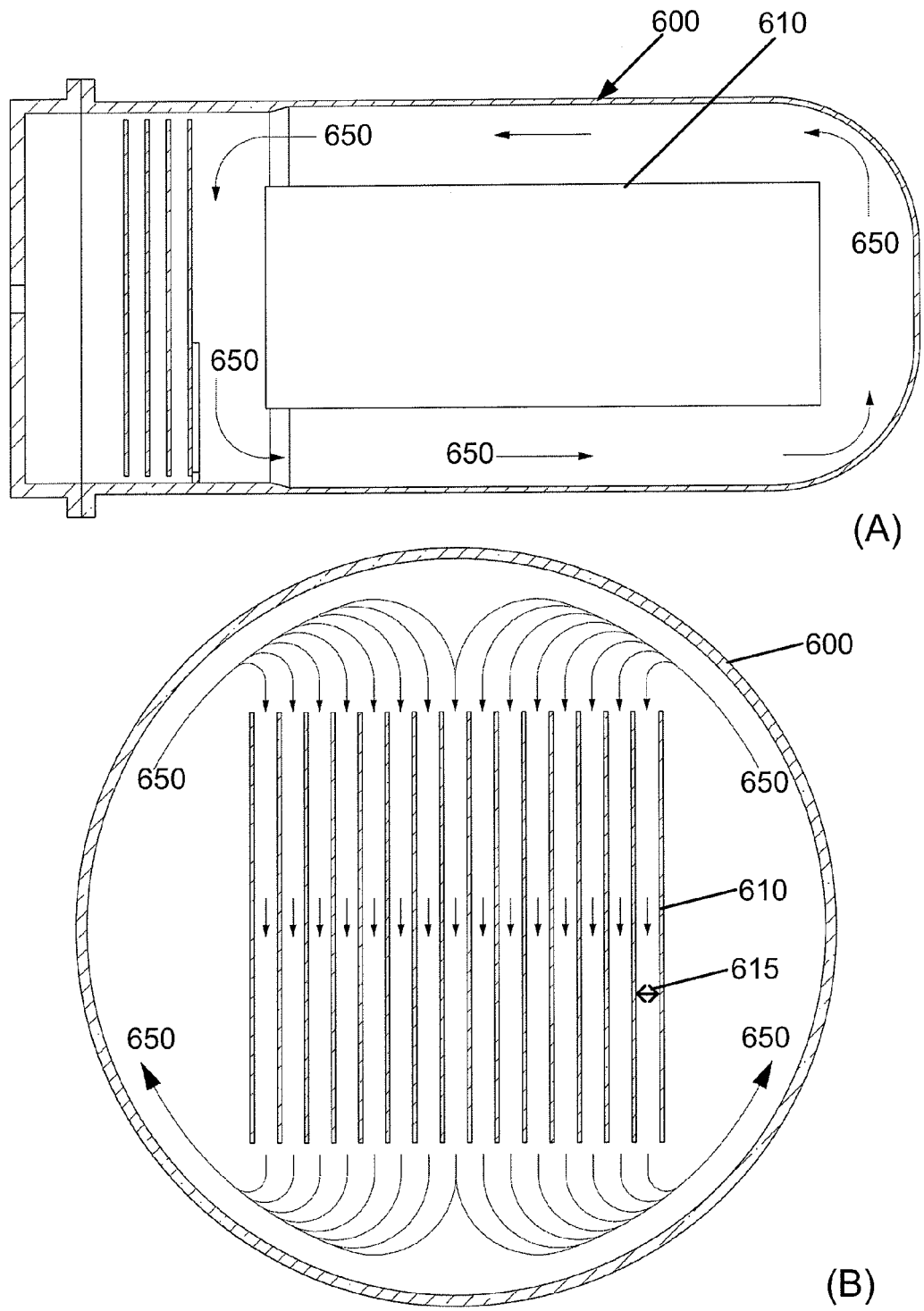
FIG. 6 is a cross-section view of convection flows according to an embodiment of the present invention.

FIG. 6 is an exemplary cross-section view of simulated convection flows according to an embodiment of the present invention. In a specific embodiment, the present invention provides a method of using a simulation model for determining at least a trend of change in temperature distribution associated with substrate loading configuration inside a tube shaped furnace. As shown, the top portion (A) of FIG. 6 is a cross-section view along an axis of a modeled tube shaped furnace 600. The modeled furnace 600 is substantially similar to real-life furnace tube 100, but is reduced in dimensions for obtaining results with a manageable computation time. In an implementation, a class of computational fluid dynamics software is used in these simulations. For example, program named CFdesign™ provided by Blue Ridge Numerics, Inc. is applied with a model based on scaled down system dimensions and material parameters and initial conditions substantially close to a real system developed according to embodiments of the present invention. Additionally shown in FIG. 6A, one of plurality of rectangular shaped planar substrates 610, also in reduced dimensions, is loaded in a central position within the model furnace 600. During one or more reactive thermal treatment processes, heated gaseous species tend to move upward and colder gaseous species flow downward to form convection flows within the volume of the model furnace 600. Based on the results from simulation, FIG. 6A shows at least part of the convection flow 650 along the axial cross section plane moving in a spatial region between the furnace inner wall and the edges of the substrate 610.

FIG. 6B provides another cross-section view of the same system setup used in the simulation model. As shown, in a configuration according to an embodiment of the present invention 16 substrates 610 are loaded one by one separately with an equal spacing 615 in vertical orientation. Although it is not explicitly included in the simplified simulation model, these substrates can be supported by a sample holder. For example, a quartz boat 140 described in FIG. 1 of the specification including several grooved rods mounted on its bottom rack fixture and aligned to let at least one substrate inserted in each groove. FIG. 6B shows at least part of the convection flow 650 moving along a cross section plane perpendicular to the tube axis. Simulation results based on the CFdesign™ program indicates that the heated gaseous species flow upward along mainly the spacing between the furnace inner wall and the edges of the substrate 610 then flow downward along the spacing between the substrates 610.

The simulation results also include effects of geometric form factors of the system on the temperature distribution for each substrate 610. Although the absolute values may be off the real system, trends of changes associated with at least some system parameters including the furnace dimension/shape, substrate dimension, total number of loaded substrates (thermal mass), spacing between neighboring substrates, etc. can be determined. In a specific embodiment, a trend of change associated with the substrate spacing for a particular loading configuration shown in FIG. 6 can be obtained. For example in FIG. 6B a loading configuration associated with the tube shaped furnace 600 has total number of 16 substrates 610 each being disposed alone and separated from its neighbor by a spacing 615. A trend of change based on the simulation indicates that reducing the spacing 615 for loading substrates 610 more than 16 may limit the up-down convection flow resulting in poor temperature uniformity. In addition, the trend of change based on the simulation indicates that increasing the spacing 615 may further improve the substrate temperature uniformity while reducing the total number of loaded substrates 610, which affects production yield. To certain degrees, further increasing substrate spacing may not substantially improve temperature uniformity (while other system parameters may become major factors). Therefore, an optimal loading configuration for a specific system setup can be practically determined and recommended for real system. Of course, there are many other alternatives, variations, and modifications.

Figure 7:
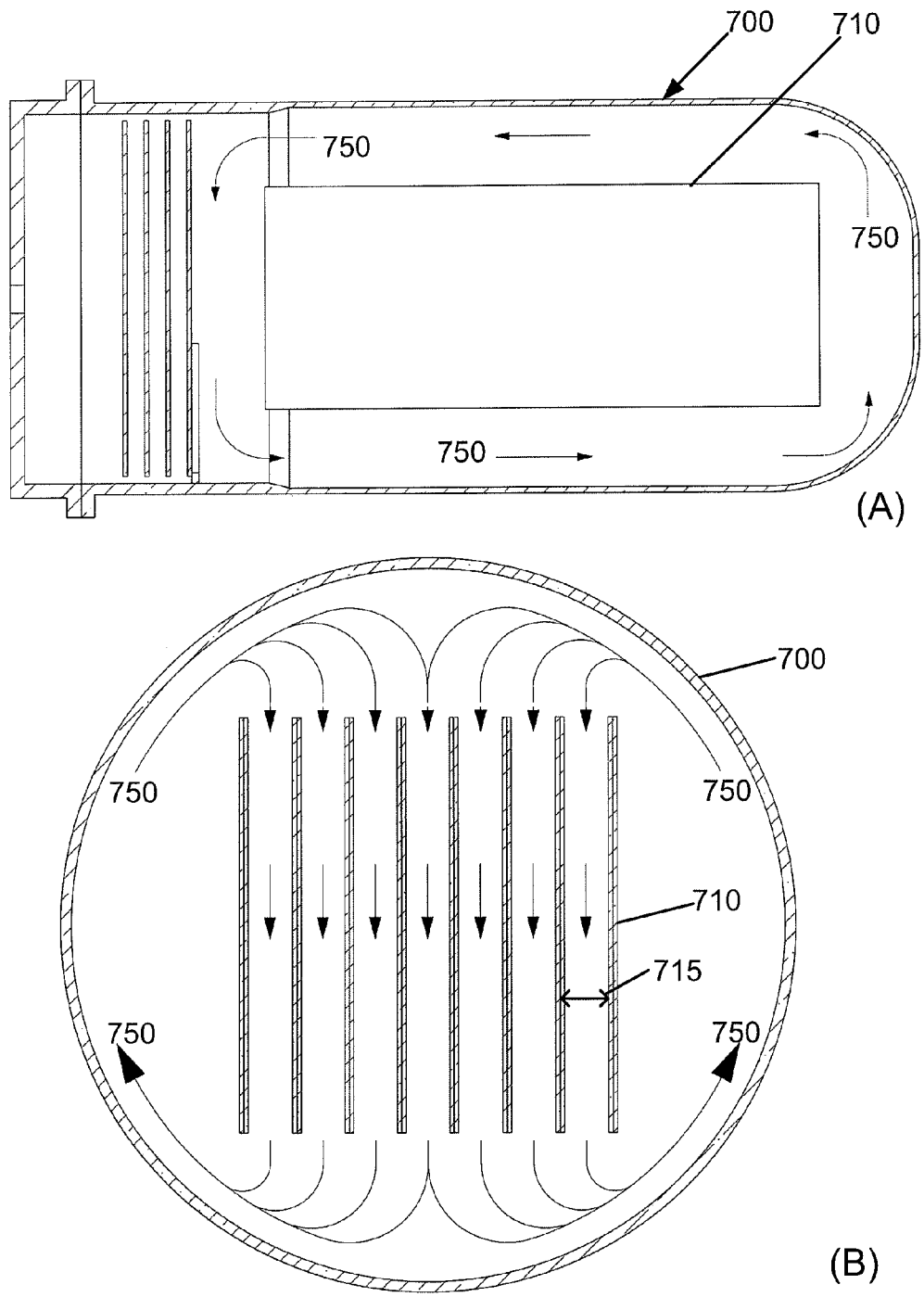
FIG. 7 is a cross-section view of convection flows according to another embodiment of the present invention.

FIG. 7 is an exemplary cross-section view of convection flows according to another embodiment of the present invention. As shown, in another embodiment of the present invention, a simulated convection flow pattern 750 is plotted for a modeled system with a plurality of planar substrates 710 being disposed in a back-to-back paired configuration within a tube shaped furnace 700. FIG. 7A shows at least a portion of convection flow 750 along an axial plane and between inner wall of the furnace 700 and edges of the substrates 710. FIG. 7B shows at least another portion of convection flow 750 along a cross-section plane perpendicular to the axis of the furnace tube 700. The furnace 700 is substantially the same as model furnace 600, based on real tube shaped furnace 100. FIG. 7B shows that by pairing the substrates the substrate spacing 715 between each pair is doubled while total number of substrates 710 can be kept the same.

This loading configuration takes advantage of the substrate samples with only single-side surface subjected to the reactive thermal treatment. According to embodiments of the present invention, the substrates 710 are glass substrates with front surface pre-coated by several thin-film materials including bottom electrode film and an exposed precursor film overlying the electrode film and the opposite back surface may be simply a bare glass. During reactive thermal treatment processes, only the precursor film needs to be exposed to work gases filled in the volume of the furnace 700. Therefore, placing the back surface of a planar substrate against another back surface of another planar substrate certainly will not affect the expected treatment of the precursor film on the front surface while allowing more room for adjusting the spacing between the front surfaces containing precursor films. In another embodiment, this loading configuration allows increasing the total number of loaded substrates without reducing the spacing between the precursor films on the front surfaces from a neighboring pair of substrates. As a result, the loading configuration helps to enhance system production yield because of more substrates can be loaded for treatment in one setting but still allows sufficient room for gaseous species to flow between the subjected precursor film surfaces and induce an effective thermal convection good for substrate temperature uniformity. Again this is modeled using a system with reduced dimension or total number of loaded substrates. Although the absolute values regarding the loading configuration and resulted temperature difference across each substrates may not match real system, a trend of change can be determined and provide guidance for optimizing processing parameters of actual system depending on one or more embodiments. Of course, there are many variations, alternatives, and modifications.

While the present invention has been described using specific embodiments, it should be understood that various changes, modifications, and variations to the method utilized in the present invention may be effected without departing from the spirit and scope of the present invention as defined in the appended claims. For example, the tubular shaped furnace is illustrated as an example. In addition to use an optimized loading configuration for the plurality of substrates, a carefully optimized heating/cooling supply system and heater/cooler configuration can also significantly improve temperature uniformity across the substrates as large as about 2 feet by 5 feet or greater for thin-film photovoltaic devices. Additionally, although the above embodiments described have been applied to reactive thermal treatment for forming CIS and/or CIGS photovoltaic film stack on the substrate, other thin-film based reactive thermal treatment processes certainly can also be benefited from the embodiments, without departing from the invention described by the claims herein. Depending on the embodiment, the present method can also be applied to silicon based photovoltaic devices.

What is claimed is:

1. A method of holding a plurality of planar substrates for thermal treatment comprising:
providing a tube shaped furnace having a first end and a second end, the tube shaped furnace being surrounded by a plurality of heaters for conducting a thermal treatment process, the first end having a door;
providing a boat fixture having a base frame coupled to a top frame, the base frame including two length portions and a first width portion, a second width portion, and at least one middle member connected between the two length portions;
mounting a grooved member on the first width portion, the second width portion, and the at least one middle member, each grooved member having a plurality of grooves;
inserting a plurality of planar substrates into the boat fixture so that the grooved member on the first width portion, the second width portion, and the at least one middle member, supports each of the planar substrates in a manner such that each substrate is separated from adjoining substrates by a desired distance;
loading the boat fixture into the tube shaped furnace from the first end; and
subjecting the plurality of planar substrates to the thermal treatment process.

2. The method of claim 1 wherein the tube shaped furnace comprises quartz material and encloses a volume of a gaseous environment having at least selenium or sulfur during the thermal treatment process.

3. The method of claim 1 wherein the step of inserting the plurality of planar substrates into the boat fixture comprises loading each planar substrate into the grooves in a vertical orientation.

4. The method of claim 3 wherein the step of inserting the plurality of planar substrates into the boat fixture comprises disposing each planar substrate substantially parallel to each other.

5. The method of claim 4 the substrates are spaced apart with a desired spacing between substrates.

6. The method of claim 1 further comprising mounting a further grooved member to the top frame for guiding the plurality of planar substrates into the boat fixture.

7. The method of claim 1 further comprising replacing each first grooved member on the base frame by a second grooved member respectively on the first width portion, the second width portion, and each of the at least one middle members, each second grooved rod having a second plurality of grooves in a second spatial configuration.

8. The method of claim 7 wherein the second spatial configuration comprises an arrangement of the plurality of planar substrates wherein each planar substrate inserted after insertion has a front surface directly facing a back surface of another planar substrate inserted in a neighboring groove, the front-front surface spacing being at least equal to or greater than the desired distance and the back-back surface spacing being substantially smaller than the front-front surface spacing.

9. The method of claim 8 wherein the second spatial configuration comprises an arrangement of the plurality of planar substrates wherein the back-to-back surface spacing is substantially zero.

10. The method of claim 8 wherein the front surface of each substrate comprises a photovoltaic precursor film including at least copper, indium, and gallium species.

11. The method of claim 1 wherein each of the plurality of planar Substrates comprises glass having a form factor selected at least from 65 cm×165 cm rectangle, a 20 cm×50 cm rectangle, a 20 cm×20 cm square.

12. The method of claim 1 wherein the desired distance for maintaining a convection flow between two neighboring planar substrates so that a temperature difference within each planar substrate can be less than 15 degrees Celsius at least during a dwell stage of the thermal treatment process.

13. The method of claim 12 wherein the desired distance is partially determined by process parameters including a total number of the plurality of planar substrates inserted in the boat fixture, a dimension of each planar substrate, a spatial dimension of the tube shaped furnace, and structural configuration of the boat fixture inside the tube shaped furnace.

14. The method of claim 12 wherein the desired distance is further determined by a setup of the plurality of heaters associated with the tube shaped furnace including a placement configuration and a ramping rate of temperature.

15. The method of claim 12 wherein the desired distance is further determined using a computational model based on a simulation system having a scaled down physical dimension and number of substrates.

* * * * *